United States Patent [19]
Ott

[11] Patent Number: 6,154,508
[45] Date of Patent: Nov. 28, 2000

[54] METHOD AND SYSTEM FOR RAPIDLY ACHIEVING SYNCHRONIZATION BETWEEN DIGITAL COMMUNICATIONS SYSTEMS

[75] Inventor: Stefan Ott, Munich, Germany

[73] Assignee: VLSI Technology, Inc., San Jose, Calif.

[21] Appl. No.: 09/046,890

[22] Filed: Mar. 23, 1998

[51] Int. Cl.[7] .................................................. H04L 7/00
[52] U.S. Cl. .......................... 375/354; 375/373; 327/141
[58] Field of Search .................................. 375/354, 373, 375/374, 375; 348/581; 331/1, 17; 327/147, 148, 151, 152, 141, 142

[56] References Cited

U.S. PATENT DOCUMENTS

| | | | |
|---|---|---|---|
| 4,510,462 | 4/1985 | Edwards et al. | 331/1 |
| 5,636,249 | 6/1997 | Roither | 375/282 |
| 5,903,197 | 5/1999 | Kikugawa | 331/17 |
| 5,903,748 | 5/1999 | McCollough et al. | 395/558 |
| 5,959,691 | 7/1999 | Koh | 348/581 |

*Primary Examiner*—Temesghen Ghebretinsae
*Assistant Examiner*—Kevin M. Burd
*Attorney, Agent, or Firm*—Wagner Murabito & Hao LLP

[57] ABSTRACT

A clock synchronization circuit for synchronizing a first communications device and a second communications device to enable digital communication between the devices. The clock synchronization circuit includes an oscillator circuit adapted to generate a base clock signal. A first frequency divider is coupled to the oscillator circuit. The first frequency divider generates a first divider clock signal from the base clock signal. A phase comparison circuit is coupled to receive the first divider clock signal. Additionally, the phase comparison circuit is also coupled to the oscillator circuit to control the frequency of the base clock signal. The phase comparison circuit receives a reference clock signal from a first communications device and adjusts the base clock frequency to correct a phase difference between the first divider clock signal and the reference clock signal. The clock synchronization circuit further includes a second frequency divider coupled to the oscillator circuit. The second frequency divider is adapted to generate a second divider clock signal from the base clock signal, wherein the second divider clock signal varies in response to the correcting performed on the base clock signal by the phase comparison circuit. The second frequency divider subsequently provides the second divider clock signal to a second communications device such that the first communications device and the second communications device are synchronized.

18 Claims, 6 Drawing Sheets

METHOD AND SYSTEM FOR RAPIDLY ACHIEVING SYNCHRONIZATION BETWEEN DIGITAL COMMUNICATIONS SYSTEMS

TECHNICAL FIELD

The present invention relates generally to digital information systems. More particularly, the present invention relates to a method and system for synchronizing two or more digital communications systems.

BACKGROUND ART

The transmission of digital information and data between systems has become an essential part of commonly used systems. With such systems, information content is transmitted and received in digital form as opposed to analog form. Information long associated with analog transmission techniques, for example, television, telephone, music, and other forms of audio and video, are now being transmitted and received in digital form. The digital form of the information allows signal processing techniques not practical with analog signals. In most applications, the user has no perception of the digital nature of the information being received.

Traditional modes of communication often occur in "real time." For example, a telephone conversation occurs in real time. A "live" television sports broadcast occurs in real time. Users have come to expect these and other such traditional forms of communication to be in real time. Thus, digital transmission and reception techniques and systems need to provide for the real time transmission and reception of information.

There is a problem, however, in that digital communication between devices distant from each other usually precludes the availability of identical sampling frequencies. Except for those cases where a distinct clocking hierarchy structure can be defined and a common distributed clock source employed, there will be some difference between the sample rate of one device (e.g., the transmitter) and the sample rate of the other device (e.g., the receiver).

Prior Art FIG. 1 shows a typical prior art digital information transmission and reception system 100. In system 100, a signal source 101, for example, a video camera, generates an analog input signal. The input signal is coupled to a sampler-ADC (analog to digital converter) 102, where it is sampled and encoded into a digital pulse code modulated signal. This signal is transmitted across a transmission link to a sampler 103. Sampler 103 is coupled to a DAC (digital to analog converter) reconstruction filter 104. The sampler 103 samples the pulse code modulated signal received via the transmission link. The sampling creates a digital signal, which is subsequently coupled to the DAC-reconstruction filter where it is decoded and filtered into an output signal. The output signal represents the input signal from signal source 101.

To maintain synchronization between the devices on either side of the communications link, sophisticated synchronization technology has been developed. In most instances, the synchronization technology functions adequately. Consequently, digital communications systems (e.g., digital television, digital telephony, etc.) have proliferated and become widely accepted. The synchronization performance obtainable with conventional, prior art synchronization technology is sufficient to allow most applications (e.g., digital television) to function as intended.

Prior Art FIG. 2 shows a digital communications system 200 employing a typical prior art synchronization scheme. System 200 includes a transmitting device 201 sending a data signal to a receiving device 202. Transmitting device 201 provides a transmitter clock signal to a phase comparison circuit, phase locked loop (PLL) 203. PLL 203 generates a voltage output, $V_{out}$, which is coupled to a VCO (voltage controlled oscillator) 205. $V_{out}$ controls the frequency of a clock signal, CLOCK A, generated by VCO 205. CLOCK A is coupled to a frequency divider 204, where it is divided, typically by some large integer factor, to produce a clock signal CLOCK B. PLL 203 compares the phase of CLOCK B and the transmitter clock and adjusts $V_{out}$ until CLOCK B and the transmitter clock are in phase.

When the transmitter clock and CLOCK B are in phase, PLL 203 supplies a lock indication signal to receiving device 202, informing the device it can now reliably use CLOCK B to sample the DATA signal from transmitting device 201. Only after this time (e.g., phase lock) can reliable communication occur.

It should be noted that the transmitting device 201 and receiving device 202, as with most digital communications systems, are able to adjust their clock frequencies within a certain range "$F_w$" about a nominal frequency "$F_o$", at a certain rate. When communication is initiated between the transmitter device 201 and the receiving device 202, the initial phase difference between the transmitter clock and the receiver clock can be any value within a range of zero degrees to 180 degrees. Hence, based upon the rate at which the frequencies and phases can be adjusted, and based upon the size of the range, system 200 will require a significant amount of time to acquire phase lock.

For example, in case where system 200 is a DECT (Digital Enhanced Cordless Telephony) system connected to an ISDN central office branch exchange where the transmitter clock frequency=8 kHz and $(F_w/F_o)=10^{-5}$, phase lock time may run up to seven seconds. Phase lock time can increase even more significantly if the transmitter clock frequency or the receiver clock frequency (e.g., CLOCK B) deviates from $F_o$. Acquiring phase lock requires that the CLOCK B signal be tuned to deviate as much as possible from the transmitter clock frequency so that the phases of both frequencies approach each other as fast as possible, with CLOCK B being slowly slewed by PLL 203 and VCO 205. This resembles two trucks on an uphill highway trying to catch up with each other, having the same engine horsepower.

Phase lock has to be achieved each time the phone rings before useful communication can start. Prior to synchronization, no reliable communication can be established between the two digital telephone devices. Moreover, in some digital telephone devices, the device's specifications may even require that its communications circuits be disabled during synchronization acquisition (e.g., before a stable lock condition is achieved) because frequencies may be out of their specified range during that time.

This presents an increasingly problematic situation, in that the majority of the more modern communications devices rely upon connections that are frequently established and released and tuning ranges $F_w$ are reduced. The communications link is established as needed, as rapidly as possible, and subsequently released as rapidly as possible when no longer needed (e.g., in order best to conserve frequency bandwidth, to achieve high system utilization rates, to serve more customers, and the like).

Thus, what is required is a system for digital transmission which overcomes the slow synchronization limitations of the prior art. The required system should provide for digital transmission and reception systems which achieve rapid phase lock. The required system should be capable of rapidly establishing a stable communications link as needed. The present invention provides a novel solution to these requirements.

DISCLOSURE OF THE INVENTION

The present invention provides a system for digital transmission which overcomes the slow synchronization limitations of the prior art. The system of the present invention provides for digital transmission and reception systems which achieve rapid synchronization lock. The system of the present invention is capable of rapidly establishing a stable communications link (e.g., between two digital communications devices) as needed.

In one embodiment, the present invention comprises a clock synchronization circuit for synchronizing a first communications device and a second communications device. The clock synchronization circuit includes an oscillator circuit adapted to generate a base clock signal. A first frequency divider is coupled to the oscillator circuit. The first frequency divider generates a first divider clock signal from the base clock signal. A phase comparison circuit is coupled to receive the first divider clock signal. Additionally, the phase comparison circuit is also coupled to the oscillator circuit to control the frequency of the base clock signal. The phase comparison circuit receives a reference clock signal from a first communications device and adjusts the base clock frequency to correct a phase difference between the first divider clock signal and the reference clock signal. The clock synchronization circuit further includes a second frequency divider coupled to the oscillator circuit. The second frequency divider is adapted to generate a second divider clock signal from the base clock signal, wherein the second divider clock signal varies in response to the correcting performed on the base clock signal by the phase comparison circuit. The second frequency divider subsequently provides the second divider clock signal to a second communications device such that the first communications device and the second communications device are synchronized.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

BEST MODE FOR CARRYING OUT THE INVENTION

Reference will now be made in detail to the preferred embodiments of the invention, a method and system for rapidly achieving synchronization between digital communications systems, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not unnecessarily to obscure aspects of the present invention.

The present invention provides a system for digital transmission which overcomes the slow synchronization limitations of the prior art. The system of the present invention provides for digital transmission and reception systems which achieve rapid synchronization lock. The system of the present invention is capable of rapidly establishing a stable communications link (e.g., between two digital communications devices) as needed. The present invention and its benefits are further described below.

Figure 1:
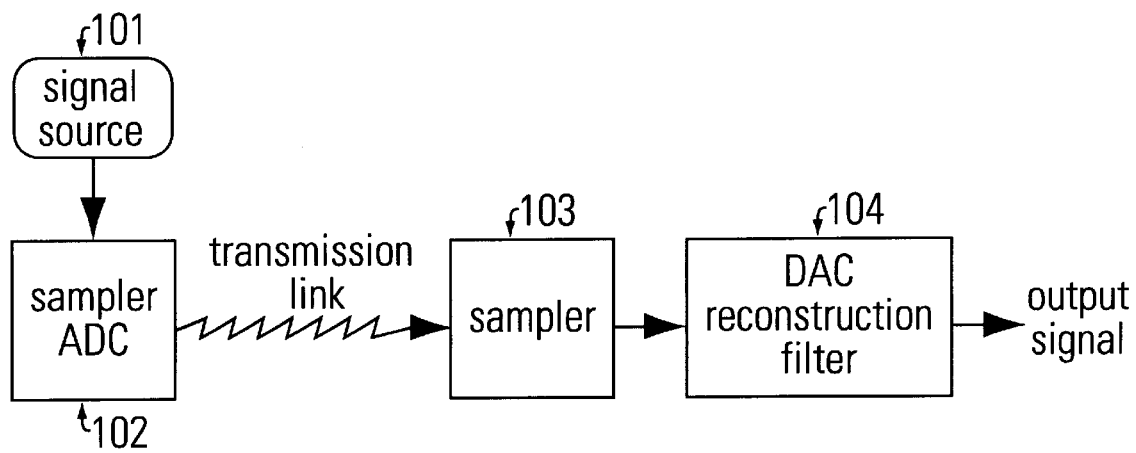
FIG. 1 shows a typical prior art digital communications system.
Figure 2:
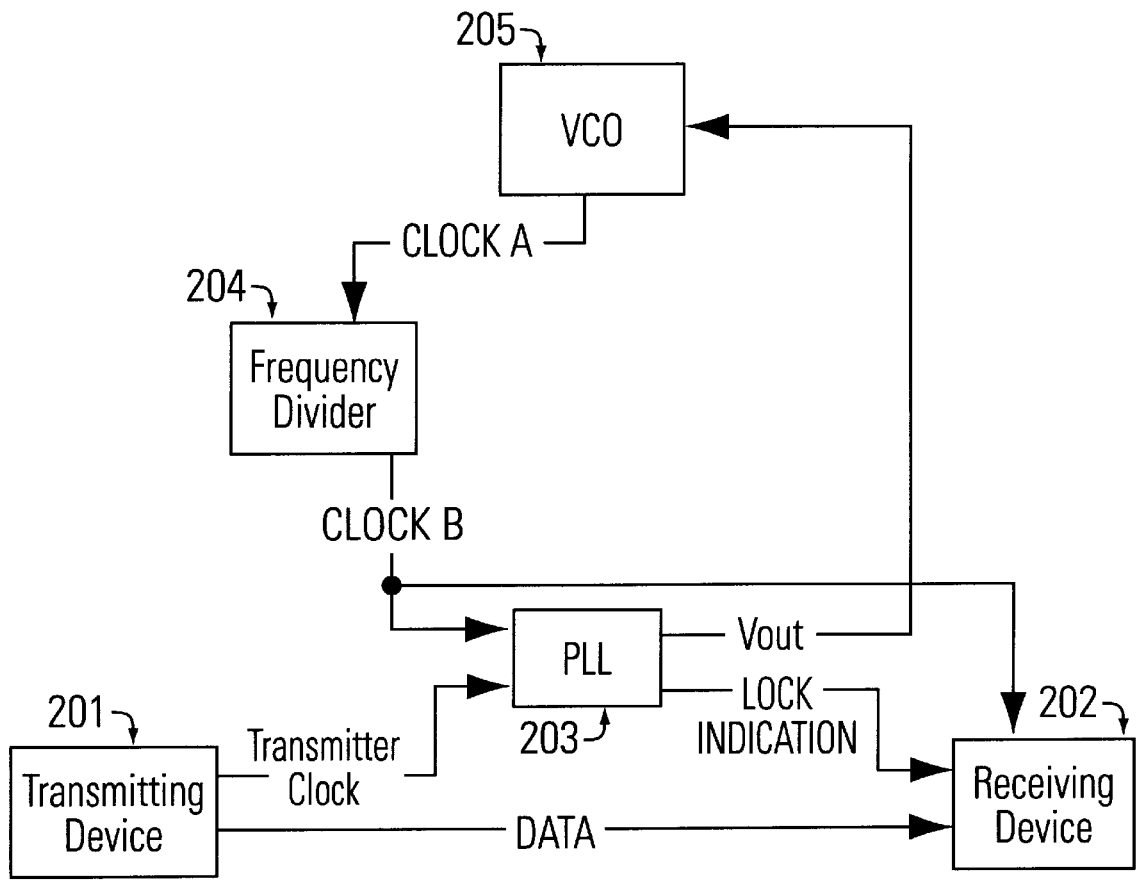
FIG. 2 shows a block diagram of a digital communications system using a typical prior art phase synchronization scheme.
Figure 3:
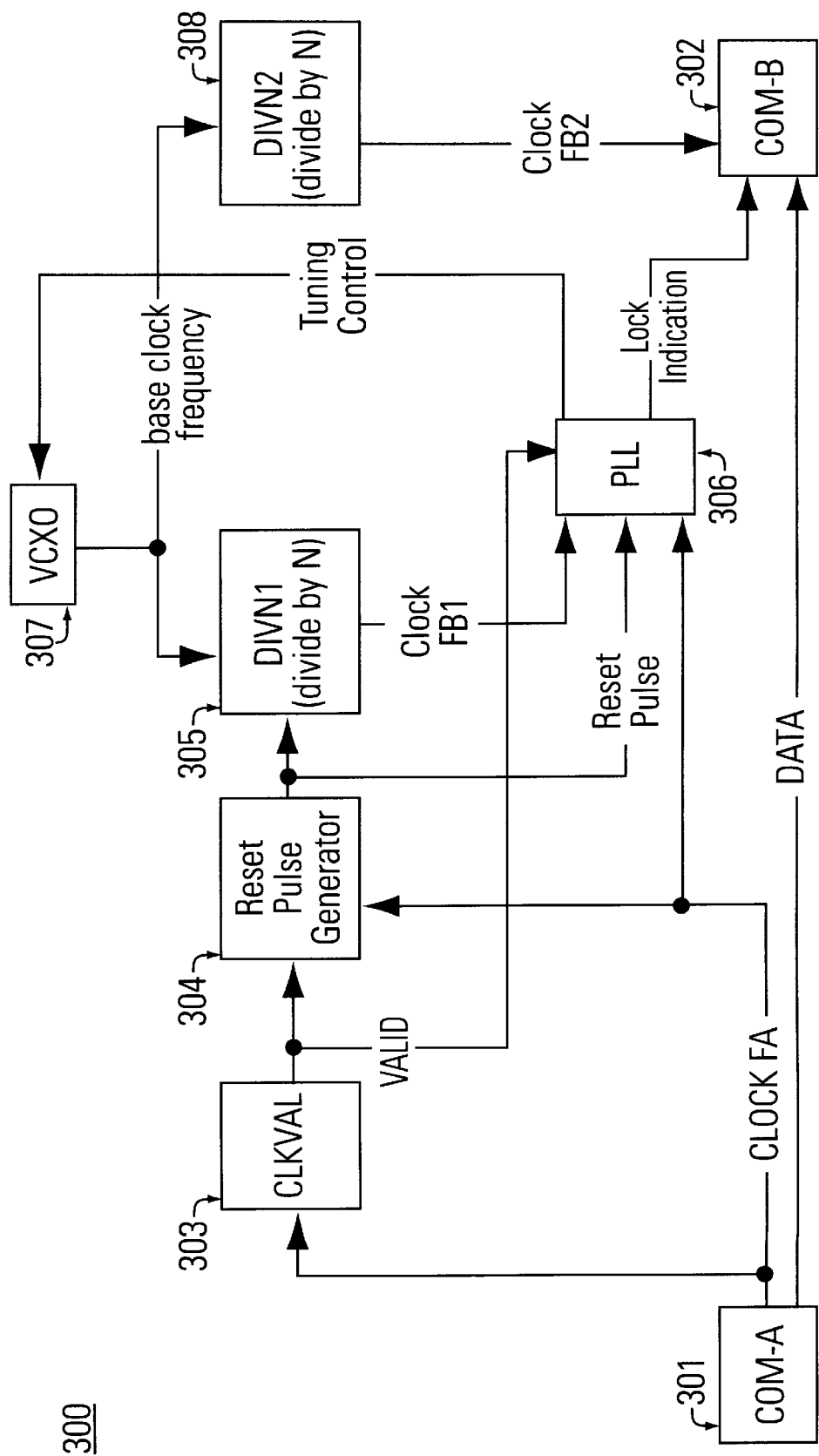
FIG. 3 shows a block diagram of a digital communications system in accordance with one embodiment of the present invention.

Referring now to FIG. 3, a block diagram of a digital communications system 300 in accordance with one embodiment of the present invention is shown. A first digital communications device, COM-A 301, is shown on the left side of FIG. 3. COM-A 301 communicates with a second digital communications device, COM-B 302, on the right side of FIG. 3 via a DATA signal line. A clock signal, CLOCK FA, is transmitted from COM-A 301 which enables the DATA signal to be sampled and the communications information to be recovered therefrom. CLOCK FA is coupled to a clock validity checking circuit, CLKVAL 303, to a reset pulse generator circuit 304, and to a phase comparison circuit, PLL 306. CLKVAL 303 generates a VALID signal which is coupled to reset pulse generator 304 and to PLL 306. Reset pulse generator 304 generates a reset pulse which is coupled to a divide by N frequency divider, DIVN1 305, and to PLL 306.

In the following discussions, the present invention, for example system 300, is described as functioning with pulse code modulated data as the DATA signal transmitted between COM-A 301 and COM-B 302 in order to teach and provide a thorough understanding of the present invention. However, it should be noted that the DATA signal can be other arbitrary forms of data communication modulation. As such, the discussions of the present invention and pulse code modulation are not intended to limit the invention to these embodiments.

DIVN1 and a second divide by N frequency divider, DIVN2 308, are coupled to receive a base clock frequency signal from a frequency generator circuit, VCXO 307. DIVN1 305 and DIVN2 308 respectively generate signals CLOCK FB1 and CLOCK FB2 from the base clock frequency signal. CLOCK FB1 is coupled to PLL 306 and CLOCK FB2 is coupled to COM-B 302. VCXO 307 receives a tuning control signal from PLL 306. COM-B 302 samples the DATA signal from COM-A 301 using CLOCK FB2. COM-B 302 also receives a lock indication signal from PLL 306.

Referring still to FIG. 3, system 300, in accordance with the present invention, functions by rapidly achieving synchronization between COM-A 301 and COM-B 302, thereby enabling immediate, stable, communications between the devices. The frequency dividers DIVN1 305 and DIVN2 308 in conjunction with reset pulse generator 304 shorten the lock time of PLL 306 by several orders of magnitude in comparison to prior art synchronization circuits, thus enabling system 300 to achieve a much more rapid (e.g., by several orders of magnitude) synchronization lock for digital transmission and reception in comparison to prior art systems. The two frequency dividers DIVN1 305 and DIVN2 308 allow system 300 of the present invention to overcome the phase dependencies present in prior art synchronization systems by achieving a frequency lock between the signals CLOCK FA and CLOCK FB2 as opposed to a phase lock. In so doing, system 300 provides for fast and efficient digital transmission and reception, free of sample slippage distortion and noise. The operation of DIVN1 305 and DIVN2 308 within system 300 is further described below.

In the present embodiment, COM-A 301 communicates with COM-B 302 via pulse code modulation (e.g., DATA) which is synchronous to the clock signal CLOCK FA. CLOCK FA is used by system 300 to sample and demodulate the information contained within the DATA signal. The frequency divider DIVN1 is designed to be resettable such that it can be restarted at 0 degrees phase. To match phase with CLOCK FA, DIVN1 is reset synchronously with, for example, the falling edge of CLOCK FA (e.g., when CLOCK FA is at 0 degrees), thus achieving a near instantaneous phase match between CLOCK FB1 and CLOCK FA. CLOCK FB1 and CLOCK FA are received by PLL 306, which subsequently adjusts the tuning control signal coupled to VCXO 307 to maintain the phase match between CLOCK FB1 and CLOCK FA. Thus, for example, the moment after DIVN1 is reset, the phase difference between CLOCK FA and CLOCK FB1 is zero, even though their frequencies are not yet matched.

In the absence of PLL 306, the phase difference between CLOCK FB1 and CLOCK FA would gradually increase until meaningful communication between COM-A 301 and COM-B 302 becomes impossible. Thus, PLL 306 functions by maintaining the phase match between CLOCK FA and CLOCK FB1. In accordance with the present invention, the phase match is obtained nearly instantaneously by synchronously resetting DIVN1 and then maintained by rapidly adjusting the base clock frequency, and thus CLOCK FB1, to match the frequencies of CLOCK FA and CLOCK FB1.

DIVN2 functions by dividing the base clock frequency by the same factor (e.g., an integer N) as DIVN1. Hence, CLOCK FB2 is substantially a replica of CLOCK FB1. As CLOCK FB1 is adjusted to match phase and frequency with CLOCK FA, CLOCK FB2 is so adjusted. However, DIVN2 is not reset with DIVN1. In so doing, COM-B 302 is not required to tolerate discontinuities in its input clock signal (e.g., CLOCK FB2). In this manner, COM-B 302 is provided with a synchronized clock signal several orders of magnitude more rapidly than possible with a typical prior art system.

With reference still to FIG. 3, CLKVAL 303 functions by constantly monitoring CLOCK FA. When CLOCK FA is active, CLKVAL asserts the VALID signal, which enables PLL 306 and reset pulse generator 304. On the next falling edge of CLOCK FA, a reset pulse is provided to DIVN1 and to PLL 306. This reset pulse resets DIVN1 305 in the manner described above, and also resets PLL 306. Due to its internal state memory, PLL 306 needs to be reset so that the pre-history of the reset pulse does not affect its tuning control output from the moment after the reset pulse. Additionally, when the VALID signal is not asserted, PLL 306 is disabled to avoid disturbances in the tuning control signal and VCXO 307.

In the present embodiment, VCXO 307 is a tunable oscillator VCXO (voltage controlled crystal 'Xtal' oscillator), generating a variable base clock frequency, where the base clock frequency divided by N=CLOCK FB1 =CLOCK FB2. The base clock frequency has a center frequency "$F_o$" and is tunable across a narrow range "$F_w$" above and below $F_o$. For example, in a case where $F_o$ is 8 kHz, $F_w/F_o$ would typically be $10^{-5}$. Hence, the relationship between VCXO 307, DIVN1 305 and DIVN2 308 can be described by the equation below:

$$F_{BN} = N \cdot CLOCK\ FB1 = N \cdot CLOCK\ FB2 = N \cdot (F_o \pm F_w) = N \cdot F_o \cdot (1 \pm 10^{-5}),$$

where $F_{BN}$ is the base clock frequency, and where $F_{BN}$ is depending on the tuning control output from PLL 306.

Thus, for example, when CLOCK FA is suddenly switched on, as in the case of an incoming phone call (e.g., in a case where COM-A 301 is a central branch office exchange, and COM-B 302 is a digital telephone), the phase difference between CLOCK FA and CLOCK FB1 is large. As described above, after the rising edge of the VALID signal, reset pulse generator 304 resets DIVN1 at the next falling edge of CLOCK FA. DIVN1 now produces a signal with the frequency of CLOCK FB2 but with the phase of CLOCK FA, $$\left(\text{the phase difference being less than } \frac{360°}{N}\right).$$

The VALID signal also enables PLL 306, which now takes control of VCXO 307 and quickly adjusts the base clock frequency to CLOCK FA•N. Thus, a very fast and stable phase lock is achieved between CLOCK FA and a phase shifted copy (CLOCK FB2), thereby providing a frequency lock between CLOCK FA and CLOCK FB2. In comparison to prior art, the lock time is reduced by a factor of N. In a typical application, N is close to 3500.

Thus, in accordance with the present invention, lock time will no longer be dominated by the VCXO frequency window width ($F_d/F_o$)=$10^{\pm 5}$ or the actual value of N. Thus, in the above example of two digital communications devices, lock time could be less than 50 ms.

It should be appreciated that although the phase lock will be achieved very quickly, no phase disturbances or phase jumps will be seen on CLOCK FB2. This is a very important feature and a significant advantage for the uninterrupted operation of COM-B 302 (e.g., which implements a digital radio link). Only slight frequency variations within the permissible range of a system specification will occur, and they will disappear once the phase lock condition is reached. Only the internal signal CLOCK FB1 will suffer from phase jumps during synchronization. CLOCK FB2 is clean, having a constant phase difference with respect to CLOCK FA. After synchronization, CLOCK FB2 has the same frequency as CLOCK FA and has a constant relative phase with respect to CLOCK FA.

Figure 4:
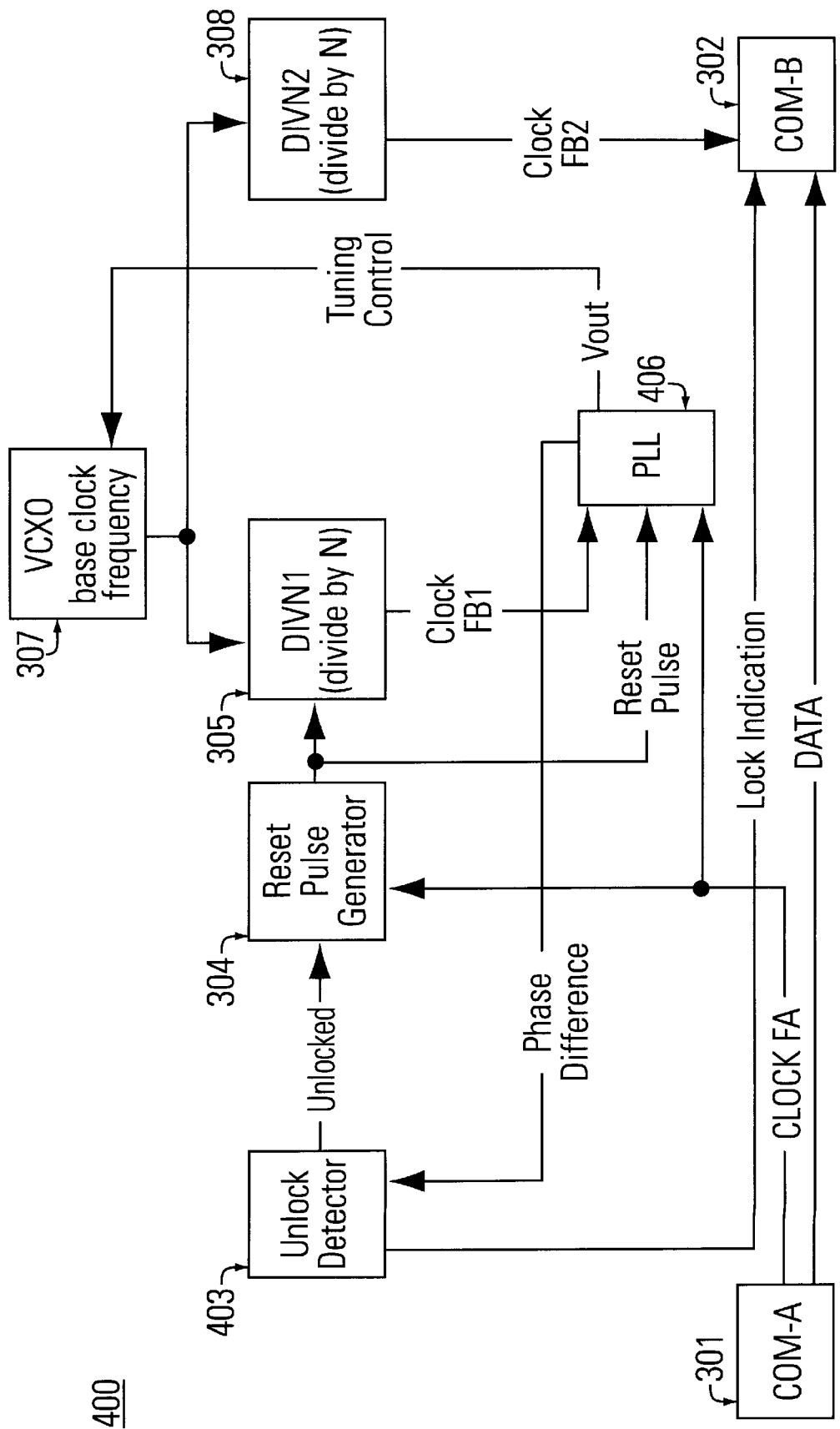
FIG. 4 shows a block diagram of a digital communications system in accordance with one alternative embodiment of the present invention.

With reference now to FIG. 4, a digital communications system 400 in accordance with an alternate embodiment of the present invention is shown. System 400 is similar to system 300 and functions in a similar manner. However, system 400 includes an unlock detector 403 as opposed to CLKVAL 303 and a PLL 406 having different inputs and outputs in comparison to PLL 306.

System 300 and system 400 differ with respect to how the reset pulse is generated, initiating the synchronization process. In system 300, CLKVAL 303 continuously monitored CLOCK FA to detect when CLOCK FA becomes active (e.g., when there is an incoming phone call, in the case where COM-A 301 is a central office branch exchange). When CLOCK FA becomes active, the reset pulse generator 304 is signaled to generate the reset pulse. In system 400, however, unlock detector 403 continuously monitors a phase difference signal from PLL 406. Unlock detector 403 determines whether there is an unlock condition by constantly monitoring the phase difference signal.

For example, in a case where COM-A 301 is a private branch exchange and COM-B 302 is a digital telephone, prior to an incoming call, CLOCK FA is out of synch with respect to the central office branch exchange. When an incoming call is received, CLOCK FA becomes synchronized to the central office branch exchange by the private branch exchange. PLL 406 detects an unlock condition, thus enabling reset pulse generator 304. Reset pulse generator 304 subsequently determines that the unlocked signal is asserted by unlock detector 403. Consequently, on the next falling edge of CLOCK FA, reset pulse generator 304 provides a reset pulse to DIVN1 305 and PLL 406. System 400 then synchronizes CLOCK FB2 and CLOCK FA in the same manner as with system 300. Thus, COM-B 302 quickly achieves synchronization with the central office branch exchange via the private office branch exchange.

System 400, in contrast with system 300, includes unlock detector 403 to continuously guard against an unlock condition. Unlock detector 403 monitors the phase difference output of PLL 406 to detect whether there is an unlock between the phases of CLOCK FA and CLOCK FB1. If an unlock is detected (e.g., as a result of a power surge in COM-A), a reset pulse is generated, and system 400 re-synchronizes. Hence, with system 400, if there is an unlock for any reason, the system will reset itself and re-synchronize.

The phase difference signal can be easily obtained from PLL 406. For example, in the present embodiment, unlock detector 403 monitors the pulse width of phase correcting pulses that occur within PLL 406. The phase correcting pulses are used by PLL 406 to generate the proper voltage for the tuning control signal. These phase correcting pulses comprise the phase difference signal provided by PLL 406 to unlock detector 403. If a certain maximum pulse width is exceeded, an unlock condition is suspected, and a reset pulse is generated upon the next falling edge of CLOCK FA. As with system 300 described above, this reset pulse resets DIVN1 305 so that the next rising edge of CLOCK FB1 coincides as close as possible with the next rising edge of CLOCK FA. Within one cycle of CLOCK FA, the CLOCK FA signal and CLOCK FB1 will be nearly synchronous. The remaining residual phase error and remaining frequency error will be removed very quickly afterwards through the normal operation of PLL 406 and VCXO 307 (e.g., less than 10 ms).

It should be appreciated that the unlock "threshold" (e.g., the limit for the maximum pulse width accepted by unlock detector 403 before asserting the unlocked signal) in unlock detector 403 can be chosen rather freely since the reset signal will lead to very close phase synchronization. Thus, for example, a pulse width of more than 0.5% of the CLOCK FA cycle time can be regarded as an unlock condition. In the actual hardware, unlock is detected whenever the pulse width exceeds 16 cycles of the base clock frequency. Typically, the unlock threshold is several times larger than the cycle time of the base clock frequency (e.g., 16 cycles), as this is the basic precision of the reset pulse.

Figure 5:
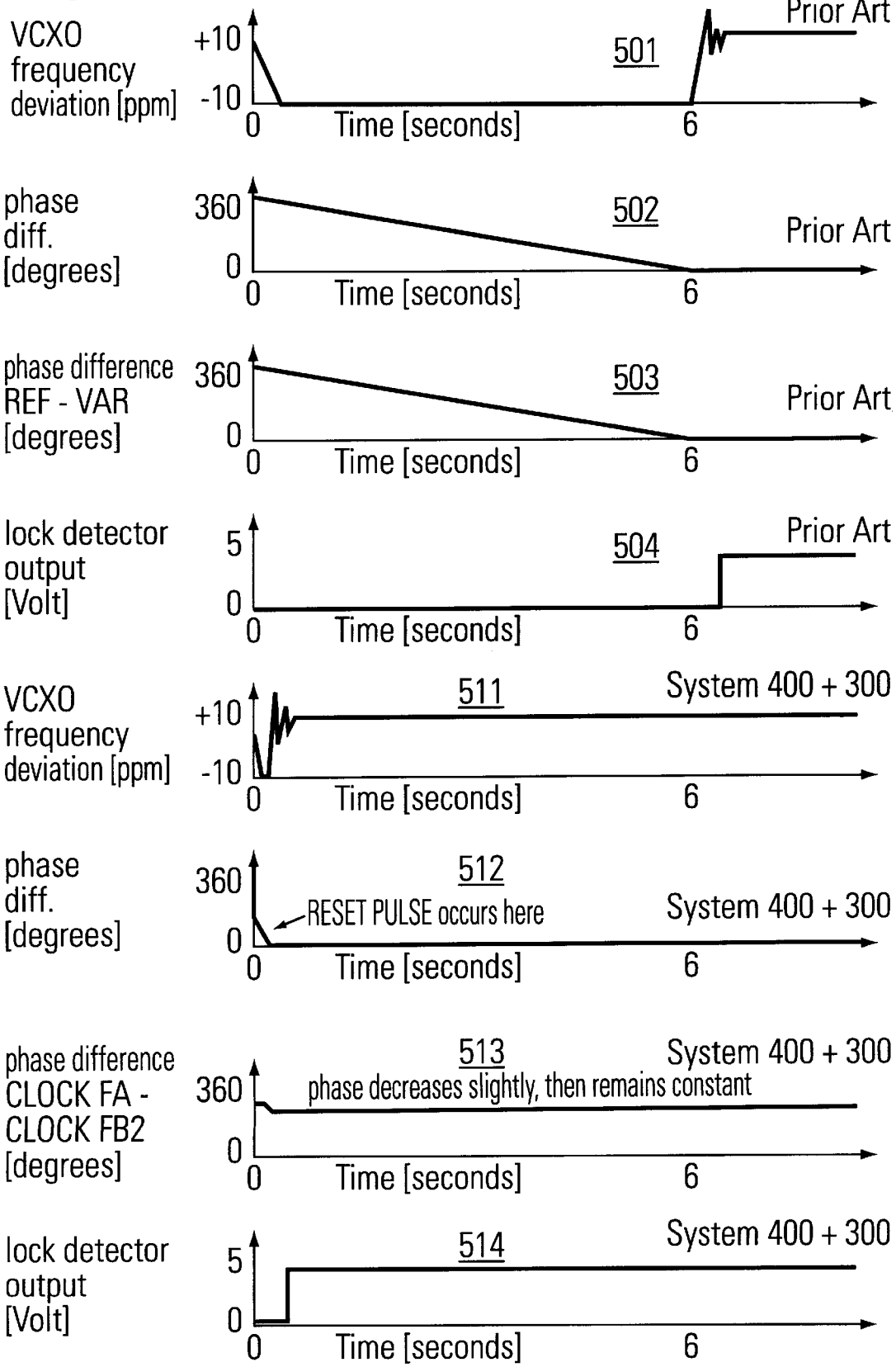
FIG. 5 shows a series of graphs of the performance of a prior art synchronization system with respect to experimental performance results of a system in accordance with the present invention.

FIG. 5 shows a series of graphs of the performance of a prior art synchronization system with respect to the experimental performance results of system 400 and system 300 (400+300) of the present invention. Graphs 501–504 show the performance of a typical prior art synchronization system. Graphs 510–514 show the performance of system 400+300 of the present invention.

With respect to prior art graphs 501–504, the frequency range of the VCXO used by the prior art system is considered to be limited by the system frequency precision specifications, in this example to a deviation of+/−10 ppm from a nominal center frequency (e.g., graph 501). The signals REF and VAR (corresponding to CLOCK FA and CLOCK FB1, respectively) initially differ in phase and frequency. In graph 501, the PLL tells the VCXO to adjust its frequency to the lowest possible within its limited range. In graphs 502 and 503, the phase of VAR slowly approaches the phase of REF at a rate of 1.25 ns per cycle. In the worst case, as shown in graphs 502 and 503, it takes about 6 seconds to reduce the phase difference to zero and achieve phase lock. The phase lock is shown in graph 504.

With respect to graphs 511–514 of the performance of system 300 of the present invention, again, the frequency range of the VCXO is considered to be limited by the system frequency precision specifications, in our example to a deviation of+/−10 ppm from a nominal center frequency (e.g., graph 511). The signals CLOCK FA and CLOCK FB1 initially differ in phase and frequency. Now there is a new signal CLOCK FB2 used to clock the device COM-B 302 (e.g., graph 512). As described above, CLOCK FB2 has the same frequency as CLOCK FB1, but a different phase. After CLOCK FA is validated by CLKVAL 303, DIVN1 305 and the PLL 306 are momentarily reset. The phase of CLOCK FB1 will now be identical to the phase of CLOCK FA within the resolution of DIVN1 305 (e.g., 1/N). Therefore, only a minimal phase difference will remain.

PLL 306 tells the VCXO 307 to adjust its frequency in order to reduce this phase error to zero (e.g., graph 513). The phase of CLOCK FB1 quickly approaches the phase of CLOCK FA at a rate of 1.25 ns per cycle. The phase of CLOCK FB2 has the same slope as the phase of CLOCK FB1. The amount of time required to reduce the phase difference to zero and achieve phase lock (e.g., graph 514) is reduced by a factor of N compared to the prior art example. Please note that for clarity, graphs 511–514 do not reflect the typically large value of N.

Figure 6:
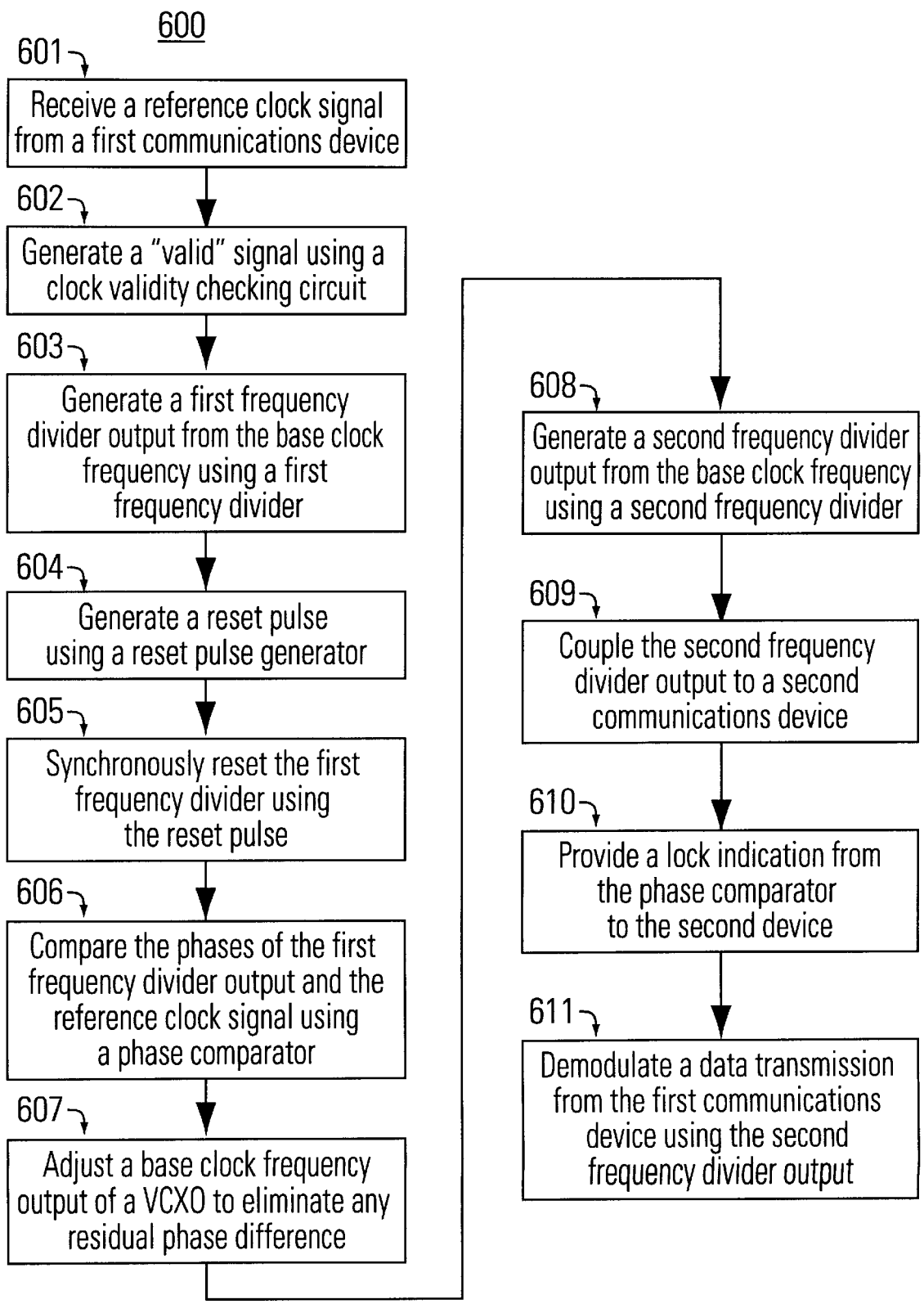
FIG. 6 shows a flow chart of the steps of a synchronization process in accordance with one embodiment of the present invention.

With reference now to FIG. 6, a flow chart of the steps of a process 600 in accordance with one embodiment of the present invention is shown. Process 600 is the operating process of a communications system (e.g., system 300 from FIG. 3) in accordance with one embodiment of the present invention.

Process 600 begins in step 601, where a reference clock signal (e.g., CLOCK FA) from a first communications device (e.g., COM-A 301) is received. As described above, the reference clock signal is transmitted by the first communications device to enable synchronization with a receiving device (e.g., COM-B 302). This reference clock signal enables decoding of its data transmission by the receiving device.

In step 602, a "valid" signal is generated using a clock validity checking circuit (e.g., CLKVAL 303). The clock validity checking circuit continually checks for the presence of the reference clock signal from the first communications device. When the reference clock signal is detected, the clock validity checking circuit generates a valid signal.

In step 603, a first frequency divider output is generated from a base clock frequency. As described above, a first frequency divider (e.g., DIVN1 305) is coupled to receive the base clock frequency from a VCXO (e.g., VCXO 307). The first frequency divider divides the based clock frequency by a factor "N" to produce the first frequency divider output.

In step 604, a reset pulse is generated using a reset pulse generator (e.g., rest pulse generator 304). As described above, the reset pulse is generated synchronous to the reference clock signal from the first communication device. The reset pulse generator generates the reset pulse when it receives a valid signal from the clock validity checking circuit.

In step 605, the reset pulse synchronously resets the first frequency divider such that the first frequency divider output and the reference clock signal have substantially the same phase. As described above, their frequencies still differ.

In step 606, the phase of the first frequency divider output and the phase of the reference clock signal are compared using a phase comparator (e.g., PLL 306). As described above, although at the moment immediately following the reset pulse, the phases of the reference clock signal and the first frequency divider output are substantially the same, their phases very quickly (e.g., in the next cycles of the reference clock signal) start drifting apart since their frequencies differ. The phase comparator generates a tuning control output which characterizes this phase difference, referred to as residual phase difference.

In step 607, the base clock frequency of the VCXO is adjusted to eliminate the residual phase difference. The VCXO adjusts its base clock frequency output in accordance with the tuning control signal received from the phase comparator. This, in turn, adjusts the frequency and phase of the first divider output. Hence, very quickly after the reset pulse, the system of the present invention achieves a phase lock between the reference clock signal and the first divider output.

In step 608, a second frequency divider output is generated from the base clock signal using a second frequency divider (e.g., DIVN2 308). As described above, the second frequency divider divides the base clock frequency by the same factor "N" as the first frequency divider. Hence, the first frequency divider output and the second frequency divider output are the same frequency. When the base clock frequency is adjusted to achieve phase lock, the second frequency divider output is correspondingly adjusted. Hence, when phase lock is achieved, the second frequency divider output precisely matches the frequency of the reference clock signal and has a precisely constant relative phase.

In step 609, the second frequency divider output is coupled to the second communications device. The second frequency divider is not reset as with the first frequency divider. Thus, the second communications device is not required to tolerate discontinuities in the second frequency divider output.

In step 610, the phase comparison circuit provides a lock indication to the second communications device indicating that the second frequency divider output is synchronized and thus reliable for use in demodulating the data from the first communications device.

In the final step, step 611, the data transmission from the first communications device is demodulated by the second communications device using the second frequency divider output. As described above, the second frequency divider output is used by the second communications device to sample the data received from the first communication device and recover the information. In accordance with the present invention, the elapsed time from the initial reception of the reference clock signal to the reliable sampling of data is several orders of magnitude shorter than elapsed times typical with the prior art.

Thus, the present invention provides a system for digital transmission which overcomes the slow synchronization limitations of the prior art. The system of the present invention provides for digital transmission and reception systems which achieve rapid synchronization lock. The system of the present invention is capable of rapidly establishing a stable communications link (e.g., between two digital communications devices) as needed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the Claims appended hereto and their equivalents.

What is claimed is:

1. A clock synchronization system for synchronizing a first communications device and a second communications device to enable digital communication between the devices, comprising:

a frequency generator circuit adapted to generate a base clock signal;

a first frequency divider coupled to the frequency generator circuit, the first frequency divider adapted to generate a first frequency divider clock signal from the base clock signal;

a phase comparison circuit coupled to receive the first frequency divider clock signal and a reference clock signal from a first communications device, the phase comparison circuit coupled to the frequency generator circuit to control the frequency of the base clock signal and to correct a phase difference between the first frequency divider clock signal and the reference clock signal by adjusting the base clock frequency;

a second frequency divider coupled to the frequency generator circuit, the second frequency divider adapted to generate a second frequency divider clock signal from the base clock signal wherein the second frequency divider clock signal varies in response to the adjusting, the second frequency divider clock signal adapted to be coupled to a second communications device such that the first communications device and the second communications device are synchronized; and a reset pulse generator coupled the first frequency divider, the reset pulse generator coupled to receive the reference clock signal, the reset pulse generator adapted to generate a reset pulse which resets the frequency divider synchronously with the reference clock signal to match the phase of the first frequency divider output with the phase of the reference clock signal, wherein the phase comparison circuit adjusts the base clock frequency via the frequency generator circuit to achieve a phase lock between the first frequency divider clock signal and the reference clock signal after the reset pulse, and wherein the phase lock between the first frequency divider output and the reference clock signal causes a frequency lock between the second frequency divider output and the reference clock signal.

2. The system of claim 1, wherein the phase lock between the first frequency divider output and the reference clock signal maintains a substantially constant phase difference between the second frequency divider output and the reference clock signal.

3. The system of claim 1, wherein the first frequency divider and the second frequency divider both divide the base clock frequency by a factor of N.

4. The system of claim 3, wherein a value of N is programmable.

5. The system of claim 1, wherein the second frequency divider is adapted to generate the second frequency divider output in an uninterrupted manner to the second communications device.

6. The system of claim 1, further comprising a clock validation circuit coupled to receive the reference clock signal and enable the phase comparison circuit when the reference clock signal is valid.

7. The system of claim 1, further comprising an unlock detector coupled to receive a phase difference signal from the phase comparison circuit and determine whether there is a phase lock between the reference clock signal and the first frequency divider output therefrom.

8. A clock synchronization system for rapidly achieving synchronization between a first digital communications device and a second digital communications device, comprising:

a voltage controlled oscillator circuit adapted to generate a base clock signal;

a first frequency divider coupled to the voltage controlled oscillator circuit, the first frequency divider adapted divide the base clock signal by a factor of N to generate a first frequency divider clock signal;

a phase comparison circuit coupled to receive the first frequency divider clock signal, the phase comparison circuit coupled to the voltage controlled oscillator circuit to control the frequency of the base clock signal, the phase comparison circuit adapted to receive a reference clock signal from a first digital communications device and adjust the base clock frequency to correct a phase difference between the first frequency divider clock signal and the reference clock signal;

a second frequency divider coupled to the voltage controlled oscillator circuit, the second frequency divider adapted to divide the base clock signal by N to generate a second frequency divider clock signal, wherein the second frequency divider clock signal varies in response to the correcting, and wherein the second frequency divider clock signal is coupled to a second digital communications device such that the first digital communications device and the second digital communications device are synchronized; and a reset pulse generator coupled the first frequency divider, the reset pulse generator coupled to receive the reference clock signal, the reset pulse generator adapted to generate a reset pulse which resets the first frequency divider synchronously with the reference clock signal to match the phase of the first frequency divider output with the phase of the reference clock signal, wherein the phase comparison circuit subsequently adjusts the base clock frequency via the voltage controlled oscillator circuit to rapidly achieve and maintain a phase lock between the first frequency divider clock signal and the reference clock signal, and wherein the phase lock between the first frequency divider output and the reference clock signal causes a frequency lock between the second frequency divider output and the reference clock signal.

9. The system of claim 8, wherein the phase lock between the first frequency divider output and the reference clock signal maintains a substantially constant phase difference between the second frequency divider output and the reference clock signal.

10. The system of claim 8, wherein the second frequency divider is adapted to generate the second frequency divider output in an uninterrupted manner to the second digital communications device.

11. The system of claim 8, further comprising a clock validation circuit coupled to receive the reference clock signal and enable the phase comparison circuit when the reference clock signal is valid.

12. The system of claim 8, further comprising an unlock detector coupled to receive a phase difference signal from the phase comparison circuit and determine whether there is a phase lock between the reference clock signal and the first frequency divider output therefrom.

13. A method for rapidly achieving synchronization between a first digital communications device and a second digital communications device, comprising the steps of:

a) receiving a reference clock signal from a first communications device;

b) generating a first frequency divider output from a base clock frequency using a first frequency divider;

c) resetting the first frequency divider synchronous to the reference clock frequency such that the phase of the first frequency divider output matches the phase of the reference clock signal;

d) comparing the phase of the first frequency divider output and the reference clock signal to measure a residual phase difference;

e) adjusting the base clock frequency to eliminate the residual phase difference and achieve a phase lock between the reference clock signal and the first frequency divider output;

f) generate a second frequency divider output from the base clock frequency using a second frequency divider, wherein the second frequency divider divides the base clock frequency by the same factor as the first frequency divider;

g) providing the second frequency divider output to a second communications device such that the first communications device and the second communications device are synchronized, wherein the reference clock signal and the second divider output have a constant phase relationship when the phase lock is achieved.

14. The method of claim 13, further including the step of generating a reset pulse synchronous to the reference clock signal to reset the first frequency divider.

15. The method of claim 13, further including the step of generating a valid signal when the reference clock signal is valid.

16. The method of claim 13, further including the step of providing a lock indication to the second device when the phase lock is achieved.

17. The method of claim 13, further including the step of providing an unlock signal to the second device when the phase lock between the reference clock signal and the first divider output is lost.

18. The method of claim 13, wherein achieving the phase lock causes the reference clock signal and the second divider output to be frequency locked.

* * * * *